(12) United States Patent
Gong et al.

(10) Patent No.: US 10,740,020 B2
(45) Date of Patent: Aug. 11, 2020

(54) METHOD, DEVICE AND COMPUTER PROGRAM PRODUCT FOR MANAGING DISK ARRAY

(71) Applicant: EMC IP Holding Company LLC, Hopkinton, MA (US)

(72) Inventors: Shaoqin Gong, Beijing (CN); Jian Gao, Beijing (CN); Geng Han, Beijing (CN); Jamin Kang, Beijing (CN); Xinlei Xu, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 38 days.

(21) Appl. No.: 16/169,369

(22) Filed: Oct. 24, 2018

(65) Prior Publication Data

US 2019/0129647 A1    May 2, 2019

(30) Foreign Application Priority Data

Oct. 27, 2017    (CN) .......................... 2017 1 1029821

(51) Int. Cl.
*G06F 12/00* (2006.01)
*G06F 3/06* (2006.01)
*G06F 12/02* (2006.01)
*G11C 16/34* (2006.01)
*G06F 11/10* (2006.01)

(52) U.S. Cl.
CPC ............ *G06F 3/0649* (2013.01); *G06F 3/064* (2013.01); *G06F 3/0616* (2013.01); *G06F 3/0644* (2013.01); *G06F 3/0647* (2013.01); *G06F 3/0689* (2013.01); *G06F 11/1076* (2013.01); *G06F 12/0246* (2013.01); *G11C 16/349* (2013.01); *G06F 2212/7211* (2013.01)

(58) Field of Classification Search
None
See application file for complete search history.

(56) References Cited

U.S. PATENT DOCUMENTS

| | | | |
|---|---|---|---|
| 9,292,220 B2 * | 3/2016 | Gong | G06F 3/0647 |
| 9,684,463 B1 * | 6/2017 | Alshinnawi | G06F 3/0631 |
| 9,946,465 B1 | 4/2018 | Martin et al. | |
| 9,959,054 B1 | 5/2018 | Vankamamidi et al. | |
| 10,481,820 B1 | 11/2019 | Dunbar | |
| 2013/0013850 A1 * | 1/2013 | Baderdinni | G06F 12/0868 711/103 |
| 2015/0006816 A1 * | 1/2015 | Gong | G06F 3/0647 711/114 |
| 2017/0060472 A1 * | 3/2017 | Zhuang | G06F 3/0649 |
| 2018/0150256 A1 * | 5/2018 | Kumar | G06F 12/0284 |
| 2019/0205245 A1 * | 7/2019 | Gao | G11C 16/349 |
| 2019/0258421 A1 * | 8/2019 | Reyes | G06F 3/0647 |

* cited by examiner

Primary Examiner — John A Lane
(74) Attorney, Agent, or Firm — BainwoodHuang

(57) ABSTRACT

Embodiments of the present disclosure relate to a method, device and computer program product for managing a disk array. The method comprises determining respective degrees of wear for a plurality of disks in the disk array, each of the plurality of disks comprising a plurality of disk extents, and each disk extent comprising a plurality of blocks. The method further comprises determining respective numbers of blocks that are accumulatively written into the plurality of disks during a predetermined period of time. The method further comprises migrating data among the plurality of disks based on the degrees of wear and the number of the accumulatively written blocks.

20 Claims, 6 Drawing Sheets

METHOD, DEVICE AND COMPUTER PROGRAM PRODUCT FOR MANAGING DISK ARRAY

RELATED APPLICATIONS

This application claim priority from Chinese Patent Application Number CN 201711029821.8, filed on Oct. 27, 2017 at the State Intellectual Property Office, China, titled "METHOD, DEVICE AND COMPUTER PROGRAM PRODUCT FOR MANAGING DISK ARRAY" the contents of which is herein incorporated by reference in its entirety.

FIELD

Embodiments of the present disclosure generally relate to storage management, and more specifically, to a method, device and computer program product for managing a disk array.

BACKGROUND

Redundant array of independent disks is a disk group formed by combining a plurality of independent disks in different manners. From the user's perspective, a disk array RAID is like a disk but can provide higher storage capability than a single disk and it can also provide data backup. When data on a disk extent are damaged, the damaged data may be restored through data backup so as to protect the security of user data. The different combinations of disk arrays are referred to as RAID levels, such as RAID0, RAID1, RAID5 and so on.

With the development of disk array technology, the use of mapped disk array is increasing at present. Differing from the traditional disk array having disks that may be controlled separately, a plurality of mapped disk arrays may be mapped in one disk array so that a plurality of mapped disks arrays share one disk array, which greatly improves the utilization efficiency of the disk. However, when a disk array is used to store data, the stored data may sometimes overly concentrate on some disks, which makes these disks prone to failure, while replacing these faulty disks would lead to reduction of reliability and performance of the disk array.

SUMMARY

Embodiments of the present disclosure provide a method, device and computer program product for managing a disk array.

In accordance with a first aspect of the present disclosure, there is provided a method for managing a disk array, comprising: determining respective degrees of wear for a plurality of disks in the disk array, each of the plurality of disks comprising a plurality of disk extents, and each disk extent comprising a plurality of blocks. The method further comprises determining respective numbers of blocks that are accumulatively written into the plurality of disks during a predetermined period of time. The method further comprises migrating data among the plurality of disks based on the degrees of wear and the numbers of the accumulatively written blocks.

In some embodiments, the migrating data comprises: in response to a degree of wear for a first disk being higher than that for a second disk, comparing a first number of the accumulatively written blocks in the first disk with a second number of the accumulatively written blocks in the second disk; and in response to the first number being greater than the second number, migrating at least part of data in the first disk into the second disk.

In some embodiments, migrating at least part of data in the first disk into the second disk comprises: determining the number of the accumulatively written blocks in each of a plurality of disk extents in the first disk, determining respective write heat for the plurality of disk extents of the first disk based on the number of the accumulatively written blocks in each disk extent; selecting at least one disk extent with higher write heat from the plurality of disk extents in the first disk; and migrating data in the at least one disk extent of the first disk into at least one spare disk extent in the second disk.

In some embodiments, the at least one disk extent in the first disk comprises a disk extent with the highest write heat.

In some embodiments, the method further comprises: in response to the first number being greater than the second number, migrating at least part of data in the second disk into the first disk.

In some embodiments, migrating at least part of data in the second disk into the first disk comprises: determining the number of the accumulatively written blocks in each of a plurality of disk extents in the second disk, determining respective write heat for the plurality of disk extents in the second disk based on the number of the accumulatively written blocks in each disk extent; selecting at least one disk extent with lower write heat from the plurality of disk extents of the second disk; and migrating data in the at least one disk extent in the second disk into at least one spare disk extent in the first disk.

In some embodiments, the at least one disk extent in the second disk comprises a non-spare disk extent with the lowest write heat.

In some embodiments, the first number is compared with the second number in response to the degree of wear for the first disk being higher than that for the second disk by a threshold amount.

In some embodiments, the degree of wear for a disk is determined based on an accumulative erase count and a maximum erase count of the disk.

In accordance with a second aspect of the present disclosure, there is provided an electronic device for a disk array. The electronic device comprises: a processor; and a memory having computer program instructions stored thereon, the processor executing the computer program instructions in the memory to control the electronic device to perform acts comprising: determining respective degrees of wear of a plurality for disks in the disk array, each of the plurality of disks comprising a plurality of disk extents, and each disk extent comprising a plurality of blocks; determining respective numbers of blocks that are accumulatively written into the plurality of disks during a predetermined period of time; and migrating data among the plurality of disks based on the degrees of wear and the numbers of the accumulatively written blocks.

In some embodiments, the migrating data comprises: in response to a degree of wear for a first disk being higher than that for a second disk, comparing a first number of the accumulatively written blocks in the first disk with a second number of the accumulatively written blocks in the second disk; and in response to the first number being greater than the second number, migrating at least part of data in the first disk into the second disk.

In some embodiments, migrating at least part of data in the first disk into the second disk comprises: determining the number of the accumulatively written blocks in each of a plurality of disk extents in the first disk, determining a respective write heat for the plurality of disk extents of the first disk based on the number of the accumulatively written blocks in each disk extent; selecting at least one disk extent with higher write heat from a plurality of disk extents in the first disk; and migrating data in the at least one disk extent of the first disk into at least one spare disk extent in the second disk.

In some embodiments, the at least one disk extent in the first disk comprises a disk extent with the highest write heat.

In some embodiments, the acts further comprise: in response to the first number being greater than the second number, migrating at least part of data in the second disk into the first disk.

In some embodiments, migrating at least part of data in the second disk into the first disk comprises: determining the number of the accumulatively written blocks in each of a plurality of disk extents in the second disk, determining respective write heat for the plurality of disk extents in the second disk based on the number of the accumulatively written blocks in each disk extent; selecting at least one disk extent with lower write heat from the plurality of disk extents of the second disk; and migrating data in the at least one disk extent in the second disk into at least one spare disk extent in the first disk.

In some embodiments, the at least one disk extent in the second disk comprises a non-spare disk extent with the lowest write heat.

In some embodiments, the first number is compared with the second number in response to the degree of wear for the first disk being higher than that for the second disk by a threshold amount.

In some embodiments, the degree of wear for a disk is determined based on an accumulative erase count and a maximum erase count of the disk.

In accordance with a third aspect of the present disclosure, there is provided a computer program product being tangibly stored on a non-volatile computer readable medium and comprising machine executable instructions which, when executed, cause a machine to perform steps of the method in the first aspect of the present disclosure.

BRIEF DESCRIPTION OF THE DRAWINGS

Through the more detailed description of example embodiments of the present disclosure with reference to the accompanying drawings, the above and other objectives, features, and advantages of the present disclosure will become more apparent. In example embodiments of the present disclosure, the same reference sign generally refer to the same component.

In each drawing, the same or corresponding signs refer to the same or corresponding elements.

DETAILED DESCRIPTION OF EMBODIMENTS

Figure 1:
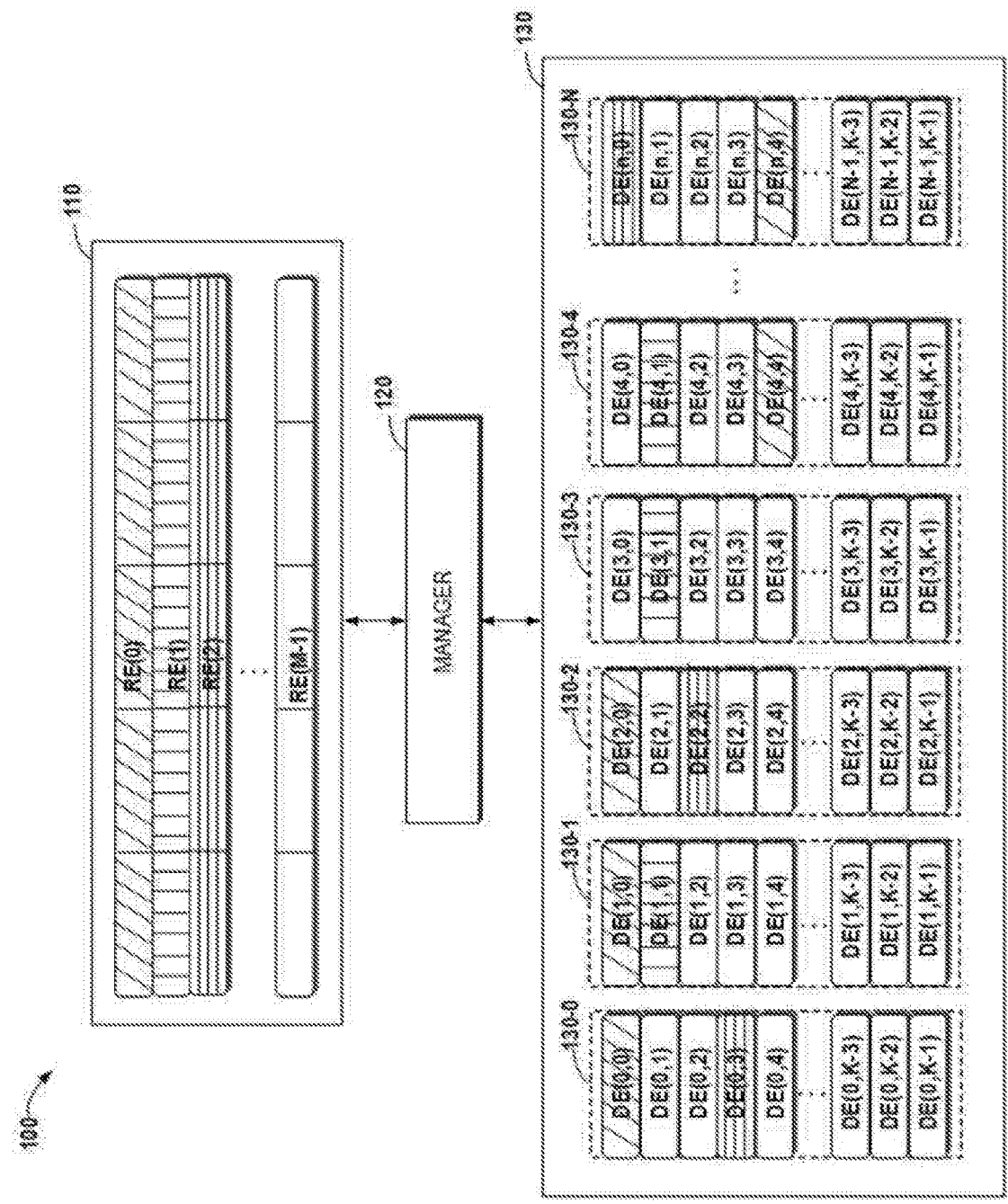
FIG. 1 is an architecture diagram illustrating a disk array 100 in accordance with embodiments of the present disclosure.

Embodiments of the present disclosure will be described in more details with reference to the drawings. Although some embodiments of the present disclosure are displayed in the drawings, it is to be understood that the present disclosure may be implemented in various manners, not limited to the embodiments illustrated herein. On the contrary, these embodiments are provided to undertand the present disclosure more thorough and complete. It is to be understood that the drawings of the present disclosure and embodiments thereof are only for illustrative purpose, rather than to limit the scope of protection of the present disclosure.

In the depiction of embodiments of the present disclosure, the term "includes" and its variants are to be considered as open-ended terms that mean "includes, but is not limited to." The term "based on" is to be understood as "based at least in part on." The term "one example embodiment" or "this embodiment" is to be read as "at least one embodiment." Terms "first," "second" and others can denote different or identical objects. The following text may also contain other explicit or implicit definitions.

In the prior art, when a disk array is used to access data, a wear levelling algorithm is provided to avoid data from overly concentrating on a certain disk block in a disk to perform write operation. However, it is found from studies on disk array that in the use of a disk array, there is aproblem that data processing overly concentrates on certain disk. In the prior art, there is only a method of wear levelling processing within a single disk and no method of wear levelling processing between disks in the disk array. If some disks in the disk array are worn too quickly due to frequent use, once these disks fail, reconstruction will be triggered. In this case, the processing costs are very high and the reliability and availability of the system will also be influenced seriously.

In order to avoid the above problem, embodiments of the present disclosure will provide a method of managing wear levelling between disks. The wear levelling between disks of the disk array is managed with an erase count obtained from the disk and a number of data blocks written into the disk to improve the service life of disks in the disk array, thereby improving the overall utilization efficiency of the disk array.

Principles of the present disclosure will be described with reference to several example embodiments shown in the drawings. Although preferred embodiments of the present disclosure are shown in the drawings, it is to be understood that these embodiments are described to enable those skilled in the art to better understand and further implement embodiments of the present disclosure, rather than to limit the scope of the present disclosure in any manner.

FIG. 1 is a schematic diagram illustrating a storage system 100 in accordance with embodiments of the present disclosure. As illustrated, the storage system 100 includes a mapped redundant array of independent disks (RAID) group 110, a manager 120 and a disk array 130. The storage system 100 receives data from an external device through an interface, stores the received data, and returns the stored data to the external data. For simplicity, the external devices and all the components connecting the external devices are not shown. It is noted that manager 120 may be implemented by means of software, hardware, firmware, or any combination thereof.

In the illustrated storage system, the disk array 130 is a storage medium for storing a large amount of data. The disk array 130 may include various volatile and/or non-volatile data storage media. Examples of storage media may include, but not limited to, magnetic disk, optical disk, hard disk, solid state disk (SSD) and cache. Alternatively or additionally, the storage media inside the disk array 130 may be of the same type. In an embodiment, the disks in the disk array are all solid state disks SSD.

The disk array 130 shown in FIG. 1 has a plurality of disks 130-0, 130-1, 130-2 . . . 130-N, where N is a positive integer. The disk array 130 is also referred to as disk pool. Disks in the disk array 130 are divided into a plurality of disk extents. In an example, each disk in the disk array 130 is divided into a same number of K disk extents, K being a positive integer, and the size of the disk extent is the same. Disk extents located in the disk are also divided into a plurality of blocks. In an example, the blocks of the disk are of the same size.

In the illustrated storage system, the manager 120 includes a processor for managing data storage inside the storage system. The processor may include, but not limited to, a central processing unit (CPU), a controller, a microprocessor, a digital signal processor (DSP) and a multi-core processor.

In the illustrated storage system, the mapped redundant array of independent disks (RAID) group 110 is a virtual storage device for storing data in different disk extents of a plurality of disks. The mapped redundant array of independent disks group 120 may be different levels of disk array, and may include, but not limited to, RAID0, RAID1, RAID0+1, RAID2, RAID3, RAID4, RAID5, RAID7, RAID10, RAID53 and so on.

When the storage system 100 receives data from an external device, it will write data stored in the RAID group into the disk extent of the physical disk of the disk array based on the mapping relation. In an embodiment, the data are written with block as the smallest storage unit. Therefore, when the data amount written into the disk extent is determined, the number of blocks that are accumulatively written into the disk extent may be counted. In an embodiment, it is possible to represent the heat of a disk extent with the number of accumulatively written blocks. In an embodiment, the number of blocks written in each disk extent or the heat of the disk extent may be acquired by the manager to manage the disk extent of each disk.

In addition to obtaining the number of blocks written into the above disk extent, the manager 120 may obtain information about the disk from the disk of the disk array. For example, it is possible to obtain the erase count of the disk and the maximum erase count of the disk from the disk. Additionally or alternatively, the manager 120 may obtain various information for the disk required by the user from the disk.

FIG. 1 above illustrates a system structural diagram of embodiments of the present disclosure. In order to illustrate the method disclosed herein of managing the disk array to realize wear levelling between disks in more detail, depiction will be made with reference to the method in FIGS. 2-5.

Figure 2:
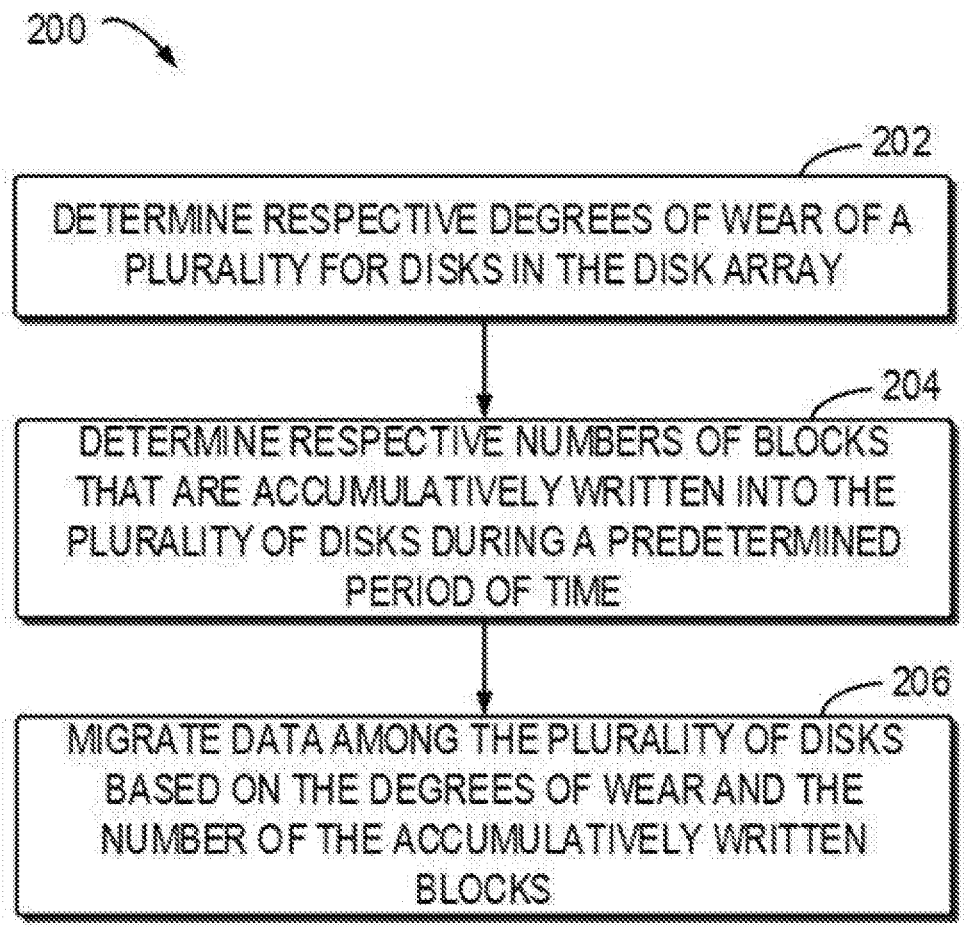
FIG. 2 is a flowchart illustrating a method 200 for managing a disk array in accordance with embodiments of the present disclosure.

FIG. 2 is a schematic diagram illustrating a method 200 of managing disk array in accordance with embodiments of the present disclosure. The disk array 130 includes a plurality of disks 130-0, 130-1, 130-2 . . . 130-N, where N is a positive integer, and each disk in the plurality of disks includes a plurality of disk extents, for instance, disk 130-0 includes disk extents DE (0, 0), DE (0, 1) . . . DE (0, K−1), where K is a positive integer, where each disk extent is further divided into a plurality of blocks. To determine the use condition of disks in the disk array, the use condition of the disks during a predetermined length of time can be obtained. In an example, the predetermine length of time is 4 hours. In another embodiment, the predetermined length of time may be configured as any proper value based on user's needs.

When method 200 is performing, statistics for the use condition of disk extents in each disk of the disk array are first made during a predetermined period of time. In an embodiment, the statistics for the use condition of disk extents within a predetermined period of time may include determining the number of blocks written into the disk extent of each disk within a predetermined period of time. Additionally or alternatively, the number of blocks written into each disk within the predetermined period of time may be determined based on a sum of numbers of blocks written into each disk extent within a predetermined period of time.

After the storage system 100 runs for the predetermined length of time, at 202, respective degrees of wear for a plurality of disks in the disk array may be obtained from the disk. The degree of wear represents the use condition of each disk. In an embodiment, the degree of wear for the disk can be determined from the cumulative erase count and the maximum erase count of the disk. For example, the degree of wear for the disk is represented by a ratio between the cumulative erase count of the disk and the maximum erase count of the disk. The higher ratio indicates that the disk has been used for a long time and its service life is shorter. In contrast, the lower ratio indicates that the disk is less used and its service life is longer.

When the degree of wear for each disk is determined, at 204, the respective numbers of accumulatively written blocks for a plurality of disks during the predetermined period of time is also determined to determine the use condition during a predetermined period of time. By determining the number of accumulatively written blocks in each disk within the predetermined period of time, the use condition for each disk may be determined. If the number of blocks written in the disk is larger, it indicates that the disk is used more frequently than the other disks, and the disk extents therein are also overly used. While if the number of blocks written into the disk is smaller within the predetermined period of time, it shows that the disk is less frequently used during the data processing process.

The imbalanced use of disks may be determined through the above information. At 206, data are migrated between a plurality of disks based on the above obtained degree of wear of each disk and the number of the accumulatively written blocks. As the degree of wear of the disk shows the extent that the disk has been used and the number of the accumulatively written blocks within the predetermined period of time indicates the extent that the disk is used within the predetermined period of time, the solution of the present disclosure may determine migration of data between disks through the above two items of data and achieve write balance between disks.

In an embodiment, in conjunction with the degree of wear and the number of accumulatively written blocks in the disk, it is determined that some data in disks with higher degree of wear are migrated into disks with lower degree of wear to reduce the use of disks with higher degree of wear. Additionally or alternatively, it is also possible to determine that some data in disks with lower degree of wear are migrated into disks with higher degree of wear to further balance the use of disks.

The above FIG. 2 illustrates a schematic method for migrating data. In the following, FIG. 3 will depict in greater detail how to determine migration of data based on degree of wear and the number of cumulative written blocks in each disk.

At 302, method 300 starts to be performed. After the storage system 100 runs for a predetermined period of time, the degree of wear of each disk in the disk array and the number of blocks written during the predetermined period of time can be obtained based on the method shown in FIG. 2.

After the degree of wear of the disk is obtained, two disks are first selected from the disk array based on the degree of wear of the disks, which are referred to as first disk and second disk in the following depiction. In an embodiment, the first disk and the second disk are selected from the disk array based on the disk degree of wear, the disk with the highest degree of wear serving as the first disk and the disk with the lowest degree of wear serving as the second disk. Alternatively or additionally, the types of disks in the disk array are the same, and then the disks with the maximum erase count or the minimum erase count are disks with the largest degree of wear and the smallest degree of wear. Alternatively or additionally, if the degree of wear of each disk in the array is the same, then two different disks serve as the first disk and the second disk respectively.

For example, SSD disks 130-0, 130-1, 130-2 . . . 130-N of the same type are shown in FIG. 1. Their erase counts are 100, 5, 10, 10 . . . 10, respectively. Through comparison, if the erase count 100 of disk 130-0 is the largest, and the erase count 5 of disk 130-1 is the smallest, since the disks are of the same type, disks 130-0 and 130-1 may serve as the first disk and the second disk, respectively.

Alternatively or additionally, the disk with the highest erase count or degree of wear and the disk with the lowest erase count or degree of wear can be obtained by sorting the erase count or degree of wear of each disk. In an alternative embodiment, the first disk and the second disk may be selected in different ways or with different methods configured by the user based on the needs.

At 304, it is determined first whether the degree of wear for the first disk is higher than that of the second disk. If the degree of wear for the first disk is higher than that for the second disk, it proceeds to 306. If the degree of wear for the first disk is no higher than that for the second disk, return and continue to run.

In an alternative embodiment, when it is determined whether the degree of wear of the first disk is higher than that of the second disk, a predetermined threshold may be set. When the degree of wear of the first disk is higher than that of the second disk as much as the set threshold, it proceeds to 306, and if no, return and continue to run. In an embodiment, the predetermined threshold may be 1%. In another alternative embodiment, the predetermined threshold may be set as any proper value based on user's needs.

When it proceeds to 306, it is determined if the number of the accumulatively written blocks in the first disk is greater than the number of the accumulatively written blocks in the second disk. This is used to determine whether the disk with higher degree of wear uses more disks during a predetermined period of time.

If the number of the accumulatively written blocks in the first disk is smaller than the number of the accumulatively written blocks in the second disk during the predetermined period of time, it indicates that the second disk is the disk that more data are written into in comparison with the first disk, and a disk with higher heat. Thus, it is unnecessary to perform data migration operation between the first disk and the second disk. Then, at 312, the second disk is removed from the disk comparison list and a new second disk is selected from the disk list. Return to 304, and continue the comparison. In an embodiment, the disk list stores information for each disk used to be compared.

If the number of the accumulatively written blocks in the first disk is larger than the number of the accumulatively written blocks in the second disk, it shows that the disk with higher degree of wear is still the disk that more data are written into within a predetermined period of time. Thus, proceed to block 308 and at least part of data of the first disk is migrated into the second disk.

In an embodiment, only the disk extent with the highest write heat or write block count in the first disk is migrated into the spare disk extent of the second disk. In another embodiment, the extent to be migrated may be determined based on user's needs.

Alternatively or additionally, after at least a part of data in the first disk is migrated into the second disk, at block 310, the at least a part of data in the second disk is also migrated into the first disk.

The operations at 308 and 310 will be described in detail below in conjunction with methods 400 and 500 in FIGS. 4 and 5, respectively.

The above method of determining data migration method is determined based on the degree of wear and the number of blocks accumulatively written into each disk. It achieves fast and accurate migration of data on disks with high degree of wear and write heat, thus avoiding migrating data on disks with low degree of wear but high write heat.

The step of migrating at least part of data of the first disk to the second disk is described in 308 of FIG. 3 above, which will be described in detail with reference to FIG. 4 below.

In order to achieve the migration of at least a part of data in the first disk, it is necessary to determine that data in which disk extents in the first disk are to be migrated. The migration of extents with high write heat can reduce data written into the disk. In an embodiment, the number of blocks written into a disk extent corresponds to the heat of the disk extent. In an embodiment, the heat of the disk extent may be represented by the number of written blocks. Therefore, migrating a hotter disk extent is namely migrating a disk extent with more written blocks, thereby reducing the number of write blocks of the whole disk.

At 402, the number of the accumulatively written blocks in each of the plurality of disk extents of the first disk is determined. The controller 120 may make a statistics of the number of disks written into each disk extent within a predetermined period of time.

At 404, the respective write heat for a plurality of disk extents in the first disk is determined. In an alternative embodiment, the write heat is represented by the number of written blocks. Therefore, the use degree of the disk extent is determined based on the write heat or the number of blocks that can be written.

At 406, at least one disk extent with higher write heat is selected from a plurality of disk extents in the first disk. In an embodiment, at least one disk extent with higher write heat refers to the disk extent with the highest write heat. In another embodiment, the disk extent with higher or highest write heat may be determined with various appropriate methods.

At 408, data in at least one disk extent of the first disk are migrated into at least one spare disk extent in the second disk. In an embodiment, data in the disk extent with the highest write heat in the first disk are migrated into a spare disk extent of the second disk. In another embodiment, it is possible to migrate any one or any number of disk extents in the at least disk extent with higher write heat into a spare disk extent of the second disk based on user's needs.

Through the above method, data in the hotter disk extent in the first disk are migrated into a spare extent of the second disk, thus reducing data written into the disk with higher degree of wear and increasing data written into the disk with lower degree of wear, so as to adjust the amount of data written into disks with different degree of wears appropriately and improve the service life of each disk in the whole disk array.

Figure 3:
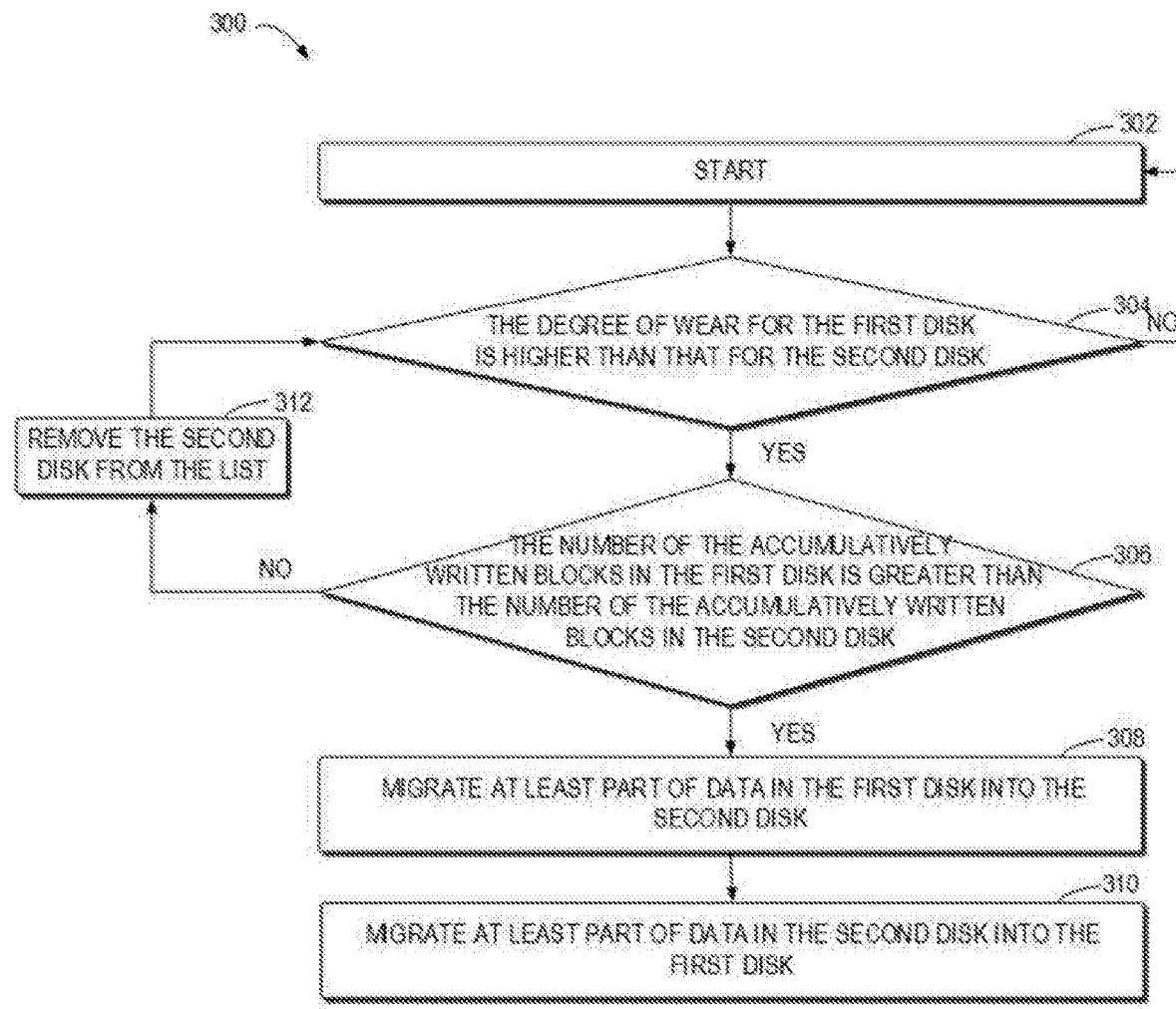
FIG. 3 is a flowchart illustrating a method 300 for determining migration for data in accordance with embodiments of the present disclosure.
Figure 4:
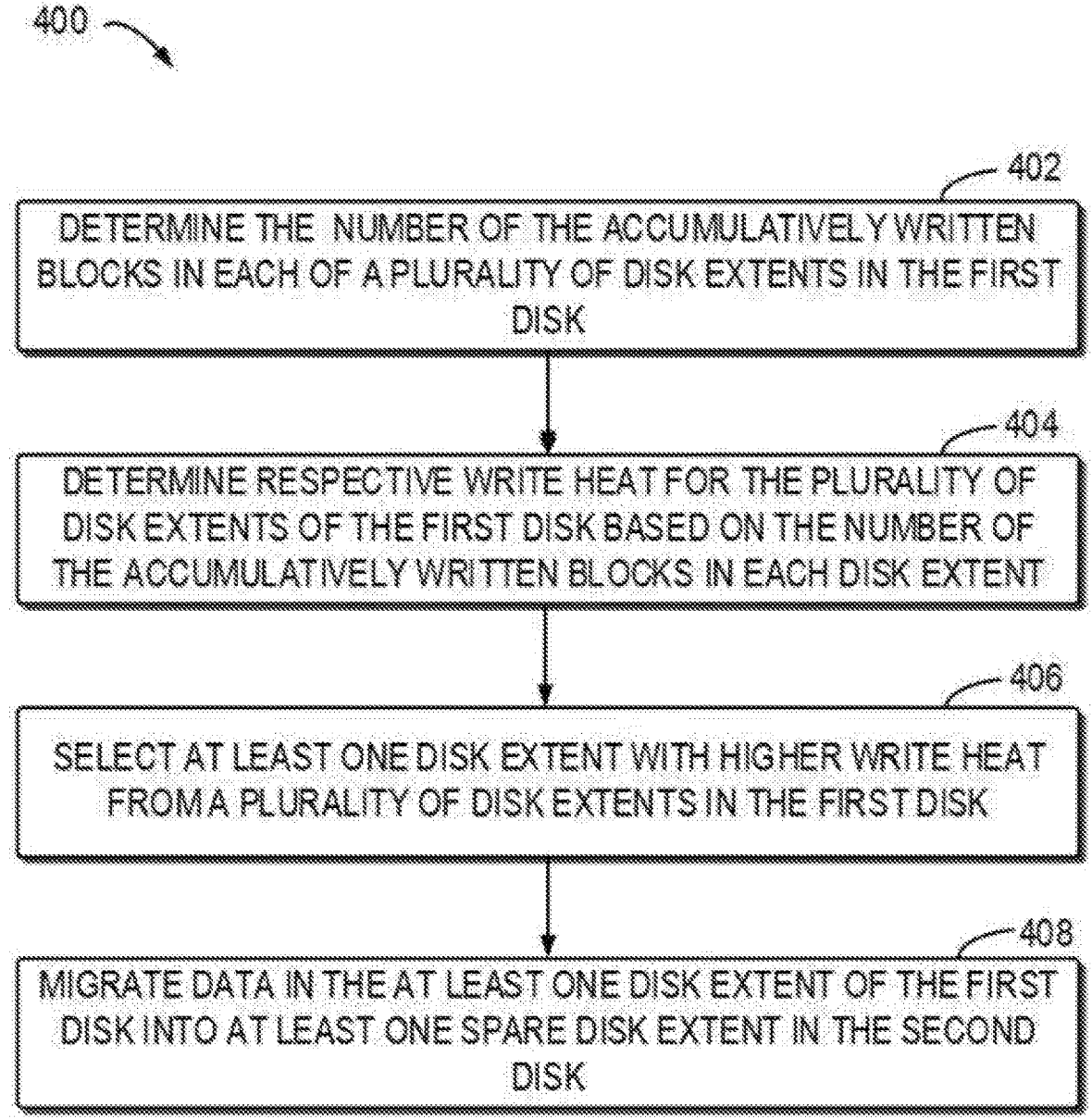
FIG. 4 is a flowchart illustrating a method 400 for migrating at least one disk extent of a first disk in accordance with embodiments of the present disclosure.
Figure 5:
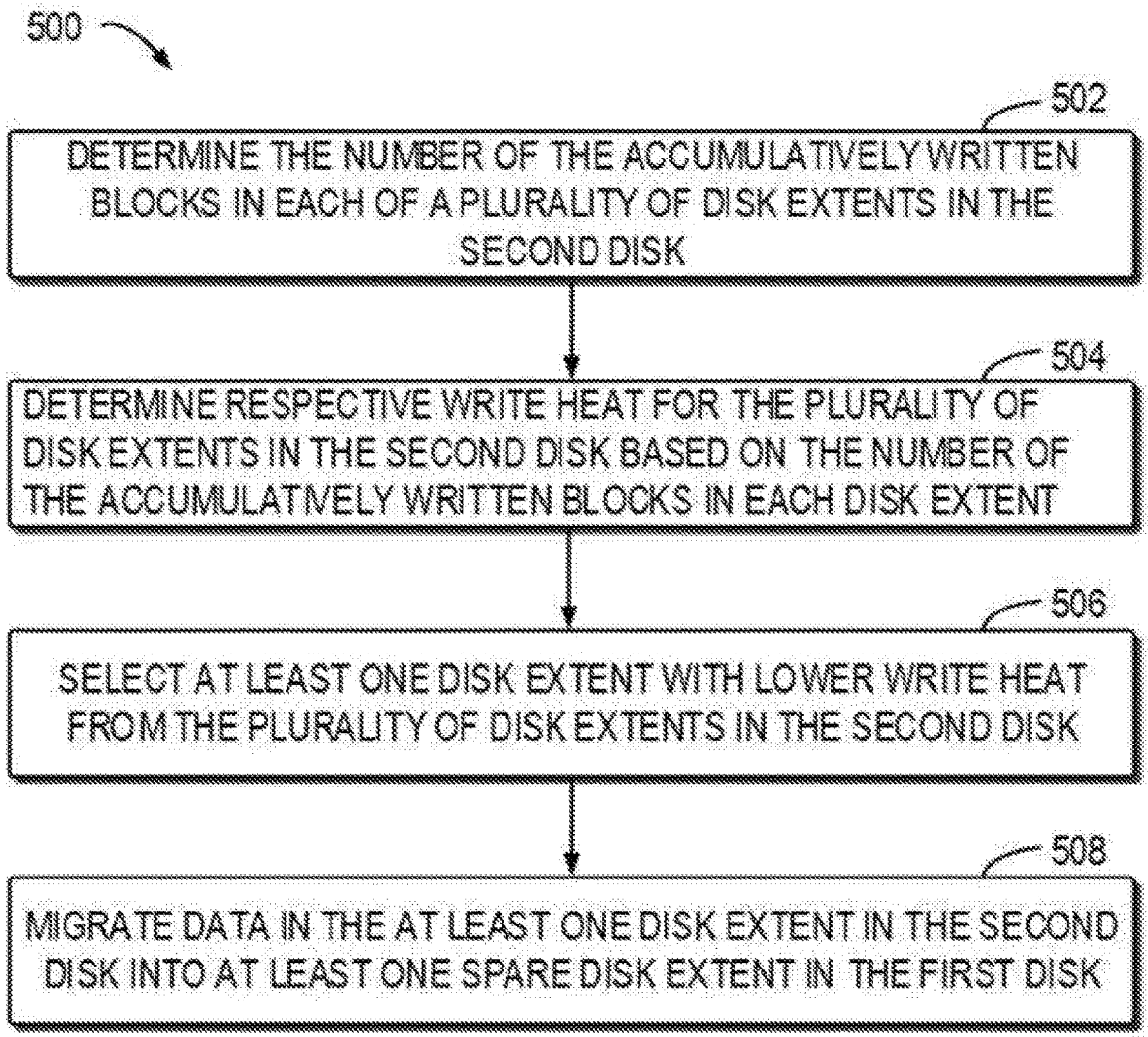
FIG. 5 is a flowchart illustrating a method 500 for migrating at least one disk extent of a second disk in accordance with embodiments of the present disclosure.

FIG. 4 above depicts the process of migrating a part of data in the first disk into the second disk as shown in 308 in FIG. 3. The process of migrating at least a part of data in the second disk into the first disk as shown in 310 in FIG. 3 will be described in detail below with reference to FIG. 5.

When migrating a part of data of the first disk into the second disk, it is also possible to migrate the disk extent with less written data in the second disk into the first disk extent to further adjust the balance of written data between disks.

At 502, the number of the accumulatively written blocks in each of the plurality of disk extents of the second disk is determined. If the number of the accumulatively written blocks in each disk extent is determined to be the same in the first disk, the number of blocks accumulatively written into each disk extent in the second disk is obtained with controller 120.

At 504, the respective write heat for a plurality of disk extents in the second disk is determined based on the number of the accumulatively written blocks in in each disk extent. In an embodiment, the write heat of the disk extent corresponds to the number of the accumulatively written blocks in the disk extent. In an alternative embodiment, the write heat of the disk extent is represented by the number of accumulatively written blocks in the disk extent.

At 506, at least one disk extent with lower write heat is selected from a plurality of disk extents of the second disk. In an embodiment, at least one disk extent with lower write heat refers to the disk extent with lowest write heat. Alternatively or additionally, at least one disk extent in the second disk includes a non-spare disk extent with the lowest write heat. In another embodiment, the disk extent with lower or lowest write heat can be determined by various appropriate methods.

At 508, data in at least one disk extent in the second disk are migrated into at least one spare disk extent in the first disk. In an embodiment, data in the disk extent with the lowest write heat in the second disk are migrated into a spare disk extent of the first disk. In another embodiment, it is possible to migrate any one or any number of disk extents among at least one disk extent with lower write heat in the second disk into a spare disk extent of the first disk based on user's needs.

With the above method, the data of the disk extent with lower write heat of the disk with lower degree of wear are migrated into the spare disk extent of the disk with higher degree of wear so as to further ensure balance between disks with lower degree of wear and disks with higher degree of wear and avoid the situation that disks with higher degree of wear are not written in the following writing process.

Figure 6:
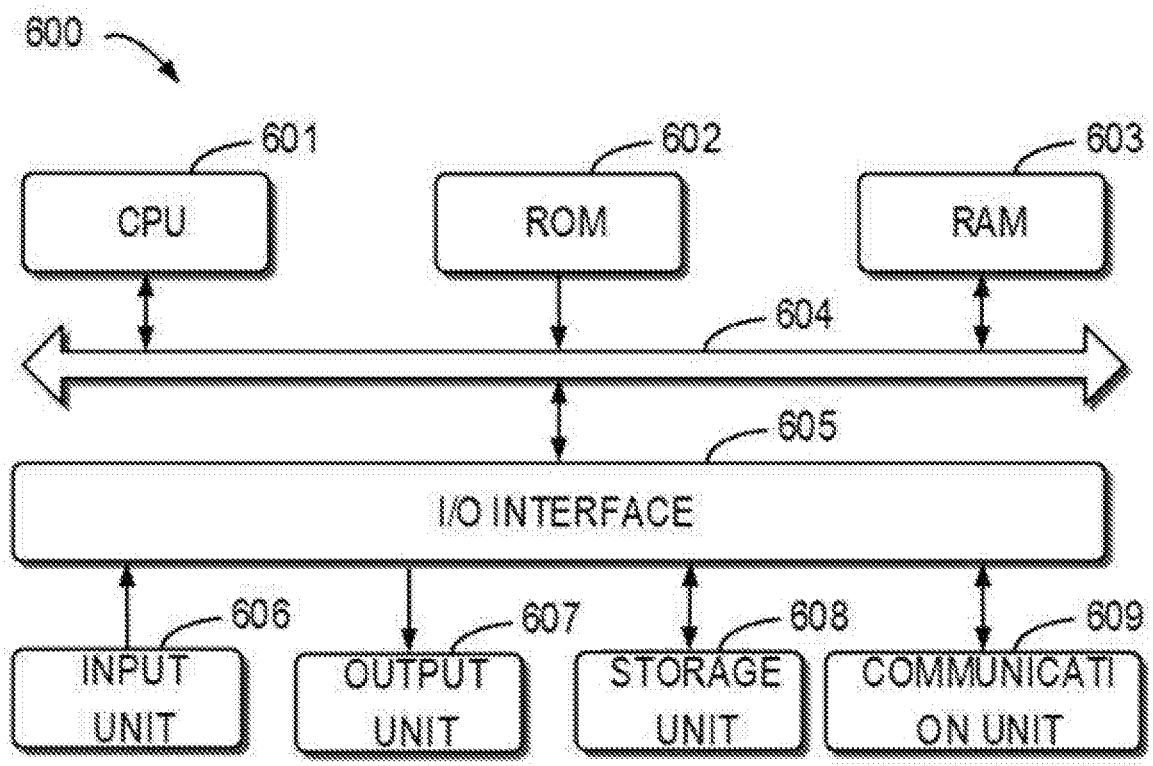
FIG. 6 is a schematic block diagram illustrating an example device 600 suitable to implement embodiments of the present disclosure.

FIG. 6 is a schematic block diagram of a device 600 that can be used to implement embodiments of the present disclosure. For example, the manager 120 for the storage system may be implemented in the device 600. As indicated, the device 600 includes a central processing unit (CPU) 601, which can execute various appropriate actions and processing based on the computer program instructions stored in a read-only memory (ROM) 602 or the computer program instructions loaded into a random access memory (RAM) 603 from a storage unit 608. The RAM 603 also stores all kinds of programs and data required by operating the storage device 600. CPU 601, ROM 602 and RAM 603 are connected to each other via a bus 604, to which an input/output (110) interface 605 is also connected.

A plurality of components in the device 600 are connected to the I/O interface 605, comprising: an input unit 606, such as keyboard, mouse and the like; an output unit 607, such as various types of displays, loudspeakers and the like; a storage unit 608, such as the disk, optical disk and the like; and a communication unit 609, such as network card, modem, wireless communication transceiver and the like. The communication unit 609 allows the device 600 to exchange information/data with other devices through computer networks such as Internet and/or various telecommunication networks.

Each procedure and processing described above, such as method 200, 300, 400 and/or 500, can be performed by a processing unit 601. For example, in some embodiments, the method 200, 300, 400 and/or 500 can be implemented as computer software programs, which are tangibly included in a machine-readable medium, such as storage unit 608. In some embodiments, the computer program can be partially or completely loaded and/or installed to the device 600 via ROM 602 and/or the communication unit 609. When the computer program is loaded to RAM 603 and executed by CPU 601, one or more steps of the above described method 200, 300, 400 and/or 500 are implemented. For example, in some embodiments, the manager 120 may be implemented by a computer program. Then, the computer program may be loaded into RAM 603 and executed by CPU 601.

Through the depiction of several example embodiments in the above, it shall be appreciated that embodiments of the present disclosure provide a method and a manager for managing disk pool in a storage system. The method and manager adjust disk extents in a more efficient manner and balance the heat of each disk, thereby reducing heat problem inside the disk significantly and improving the performance of the disk pool.

As a whole, various embodiments of the present disclosure can be implemented with hardware or dedicated circuit, software, logic or any combination thereof. Some embodiments can be implemented with hardware while some other aspects can be implemented with firmware or software. The firmware or software can be implemented by a controller, a microprocessor or other computing devices. Though aspects of the present disclosure are illustrated and depicted as block diagram, flow map or other drawings, it should be understood that the blocks, devices, systems, technologies or methods can be implemented by hardware, software, firmware, dedicated circuit or logic, universal hardware or controller or other computing devices or some combination thereof in a non-limiting manner.

Furthermore, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific embodiment details are contained in the above discussions, these should not be construed as limitations on the scope of the subject matter described herein but description of features only for specific embodiment. Certain features that are described in this specification in the context of separate embodiments can also be implemented in combination in a single embodiment. Conversely, various features that are described in the context of a single embodiment can also be implemented in multiple embodiments separately or in any suitable subcombination.

Though the present disclosure has been described with specific structural features and/or method actions, it is to be understood that the scope of the technical solution defined in the appended claims is not necessarily limited to the specific features or actions described above. In other words, the present descriptions are only optional embodiments. To those skilled in the art, embodiments of the present disclosure may have various modifications and variations. Any modifications, equivalent replacements, and improvements within the spirit and principle of embodiments of the present disclosure should be included within the protection scope of embodiments of the present disclosure.

We claim:

1. A method of managing a disk array, comprising:
    determining respective degrees of wear for a plurality of disks in the disk array, each of the plurality of disks comprising a plurality of disk extents, and each disk extent comprising a plurality of blocks;
    determining respective numbers of blocks that are accumulatively written into the plurality of disks during a predetermined period of time; and
    migrating data among the plurality of disks based on the degrees of wear and the numbers of the accumulatively written blocks;
    wherein the migrating data comprises:
        in response to a degree of wear for a first disk being higher than that for a second disk, comparing a first number of the accumulatively written blocks in the first disk with a second number of the accumulatively written blocks in the second disk; and
        in response to the first number being greater than the second number, migrating at least part of data in the first disk into the second disk.

2. The method according to claim 1, wherein migrating at least part of data in the first disk into the second disk comprises:
    determining the number of the accumulatively written blocks in each of a plurality of disk extents in the first disk;
    determining respective write heat for the plurality of disk extents of the first disk based on the number of the accumulatively written blocks in each disk extent;
    selecting at least one disk extent with higher write heat from the plurality of disk extents in the first disk; and
    migrating data in the at least one disk extent of the first disk into at least one spare disk extent in the second disk.

3. The method according to claim 2, wherein the at least one disk extent in the first disk comprises a disk extent with the highest write heat.

4. The method according to claim 1, further comprising:
    in response to the first number being greater than the second number, migrating at least part of data in the second disk into the first disk.

5. The method according to claim 4, wherein migrating at least part of data in the second disk into the first disk comprises:
    determining the number of the accumulatively written blocks in each of a plurality of disk extents in the second disk,
    determining respective write heat for the plurality of disk extents in the second disk based on the number of the accumulatively written blocks in each disk extent;
    selecting at least one disk extent with lower write heat from the plurality of disk extents of the second disk; and
    migrating data in the at least one disk extent in the second disk into at least one spare disk extent in the first disk.

6. The method according to claim 5, wherein the at least one disk extent in the second disk comprises a non-spare disk extent with the lowest write heat.

7. The method according to claim 1, wherein the first number is compared with the second number in response to the degree of wear for the first disk being higher than that for the second disk by a threshold amount.

8. The method according to claim 1, wherein the degree of wear degree for a disk is determined based on an accumulated erase count and a maximum erase count of the disk.

9. The method according to claim 1, wherein the first disk and the second disk are the same type of solid state drive.

10. An electronic device, comprising:
    a processor, and
    a memory having computer program instructions stored thereon, the processor executing the computer program instructions in the memory to control the electronic device to perform acts comprising:
        determining respective degrees of wear for a plurality of disks in the disk array, each of the plurality of disks comprising a plurality of disk extents, and each disk extent comprising a plurality of blocks;
        determining respective numbers of blocks that are accumulatively written into the plurality of disks during a predetermined period of time; and
        migrating data among the plurality of disks based on the degrees of wear and the numbers of the accumulatively written blocks;
    wherein the migrating data comprises:
        in response to a degree of wear for a first disk being higher than that for a second disk, comparing a first number of the accumulatively written blocks in the first disk with a second number of the accumulatively written blocks in the second disk; and
        in response to the first number being greater than the second number, migrating at least part of data in the first disk into the second disk.

11. The electronic device according to claim 10, wherein migrating at least part of data in the first disk into the second disk comprises:
    determining the number of the accumulatively written blocks in each of a plurality of disk extents in the first disk,
    determining a respective write heat for the plurality of disk extents of the first disk based on the number of the accumulatively written blocks in each disk extent;
    selecting at least one disk extent with higher write heat from a plurality of disk extents in the first disk; and
    migrating data in the at least one disk extent of the first disk into at least one spare disk extent in the second disk.

12. The electronic device according to claim 11, wherein the at least one disk extent in the first disk comprises a disk extent with the highest write heat.

13. The electronic device according to claim 10, the acts further comprising:

in response to the first number being greater than the second number, migrating at least part of data in the second disk into the first disk.

14. The electronic device according to claim 13, wherein migrating at least part of data in the second disk into the first disk comprises:

determining the number of the accumulatively written blocks in each of a plurality of disk extents in the second disk, determining respective write heat for the plurality of disk extents in the second disk based on the number of the accumulatively written blocks in each disk extent;

selecting at least one disk extent with lower write heat from the plurality of disk extents of the second disk; and migrating data in the at least one disk extent in the second disk into at least one spare disk extent in the first disk.

15. The electronic device according to claim 14, wherein the at least one disk extent in the second disk comprises a non-spare disk extent with the lowest write heat.

16. The electronic device according to claim 10, wherein the first number is compared with the second number in response to the degree of wear for the first disk being higher than that for the second disk by a threshold amount.

17. The electronic device according to claim 10, wherein the degree of wear for a disk is determined based on an accumulated erase count and a maximum erase count of the disk.

18. The electronic device according to claim 10, wherein the first disk and the second disk are the same type of solid state drive.

19. A computer program product for managing a disk array, the computer program product comprising:

a non-transitory computer readable medium encoded with computer-executable program code, the code configured to enable the execution of:

determining respective degrees of wear for a plurality of disks in the disk array, each of the plurality of disks comprising a plurality of disk extents, and each disk extent comprising a plurality of blocks;

determining respective numbers of blocks that are accumulatively written into the plurality of disks during a predetermined period of time; and migrating data among the plurality of disks based on the degrees of wear and the numbers of the accumulatively written blocks;

wherein the migrating data comprises:

in response to a degree of wear for a first disk being higher than that for a second disk, comparing a first number of the accumulatively written blocks in the first disk with a second number of the accumulatively written blocks in the second disk; and in response to the first number being greater than the second number, migrating at least part of data in the first disk into the second disk.

20. The computer program product of claim 19, wherein the first disk and the second disk are the same type of solid state drive.

* * * * *